(12) United States Patent
Li et al.

(10) Patent No.: US 8,883,528 B2
(45) Date of Patent: Nov. 11, 2014

(54) METHODS OF PRODUCING LIGHT EMITTING DEVICE WITH PHOSPHOR WAVELENGTH CONVERSION

(75) Inventors: Yi-Qun Li, Danville, CA (US); Yi Dong, Tracy, CA (US)

(73) Assignee: Intematix Corporation, Fremont, CA (US)

( * ) Notice: Subject to any disclaimer, the term of this patent is extended or adjusted under 35 U.S.C. 154(b) by 307 days.

(21) Appl. No.: 12/239,357

(22) Filed: Sep. 26, 2008

(65) Prior Publication Data

US 2009/0134414 A1 May 28, 2009

Related U.S. Application Data

(60) Provisional application No. 60/997,293, filed on Oct. 1, 2007.

(51) Int. Cl.
| | |
|---|---|
| *H01L 21/00* | (2006.01) |
| *H01L 33/44* | (2010.01) |
| *B29C 39/02* | (2006.01) |
| *B29C 39/10* | (2006.01) |
| *H01L 33/50* | (2010.01) |
| *B29C 39/00* | (2006.01) |
| *H01L 33/00* | (2010.01) |
| *H01J 1/62* | (2006.01) |
| *H01J 63/04* | (2006.01) |
| *B29L 11/00* | (2006.01) |

(52) U.S. Cl.
CPC .............. *H01L 33/505* (2013.01); *H01L 33/44* (2013.01); *H01L 2224/48091* (2013.01); *H01L 2224/8592* (2013.01); *B29C 39/025* (2013.01); *B29C 39/10* (2013.01); *H01L 2224/48247* (2013.01); *H01L 2933/0041* (2013.01); *H01L 2224/73265* (2013.01); *B29C 39/006* (2013.01); *H01L 2224/49107* (2013.01); *H01L 2224/32245* (2013.01); *B29L 2011/00* (2013.01)
USPC .............. 438/29; 438/127; 257/98; 257/100; 313/485

(58) Field of Classification Search
None
See application file for complete search history.

(56) References Cited

U.S. PATENT DOCUMENTS 5,998,925 A 12/1999 Shimizu et al.
6,650,044 B1 * 11/2003 Lowery .......................... 313/502

(Continued)

OTHER PUBLICATIONS

Definition of preselected. (n.d.) The American Heritage® Dictionary of the English Language, Fourth Edition. (2003). Retrieved Oct. 9, 2012 from http://www.thefreedictionary.com/preselected.*

*Primary Examiner* — Michael Jung
(74) *Attorney, Agent, or Firm* — Quire Intellectual Property Law Group, P.C.

(57) ABSTRACT

A method of fabricating a light emitting device comprises: mounting a light emitting diode chip in a package; heating the light emitting diode chip package assembly to a pre-selected temperature; and dispensing a pre-selected volume of a mixture of at least one phosphor and a light transmissive thermosetting material (silicone, epoxy) on a surface of the chip. The pre-selected volume and temperature are selected such that the phosphor/material mixture flows over the entire light emitting surface of the chip before curing. In an alternative method, using a light transmissive UV curable material such as an epoxy, the phosphor/material mixture is irradiated with UV radiation after a pre-selected time to cure the material. The pre-selected volume and pre-selected time are selected such that the phosphor/material mixture flows over at least the light emitting surface of the chip before curing.

19 Claims, 6 Drawing Sheets

(56) References Cited

U.S. PATENT DOCUMENTS

| | | |
|---|---|---|
| 7,311,858 B2 | 12/2007 | Wang et al. |
| 7,390,437 B2 | 6/2008 | Dong et al. |
| 2006/0063289 A1* | 3/2006 | Negley et al. .................. 438/26 |
| 2006/0097621 A1* | 5/2006 | Park et al. .................... 313/485 |
| 2006/0145123 A1 | 7/2006 | Li et al. |
| 2006/0158090 A1 | 7/2006 | Wang et al. |
| 2006/0199293 A1* | 9/2006 | Peh et al. ....................... 438/25 |
| 2006/0261309 A1 | 11/2006 | Li et al. |
| 2007/0029526 A1 | 2/2007 | Cheng et al. |
| 2008/0111472 A1 | 5/2008 | Liu et al. |
| 2009/0065792 A1* | 3/2009 | Thompson et al. ............. 257/98 |
| 2009/0283721 A1 | 11/2009 | Liu et al. |
| 2010/0129525 A1* | 5/2010 | Shida et al. .................... 427/10 |

* cited by examiner

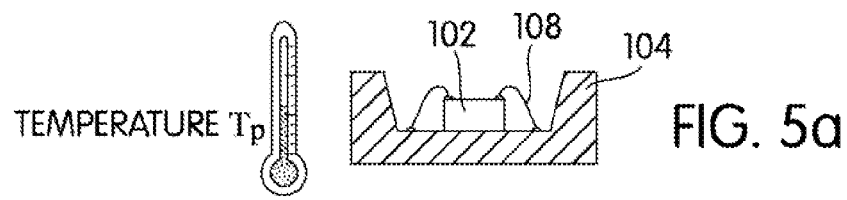
FIG. 5a
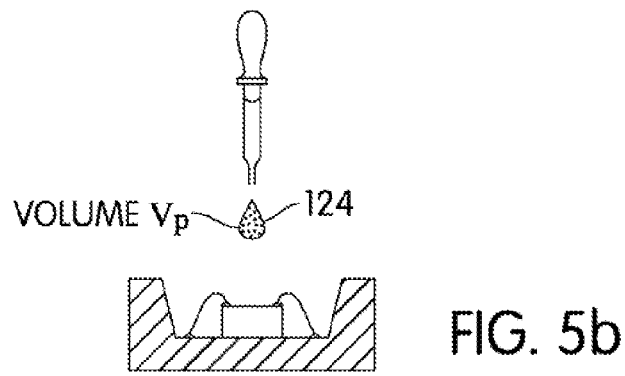
FIG. 5b
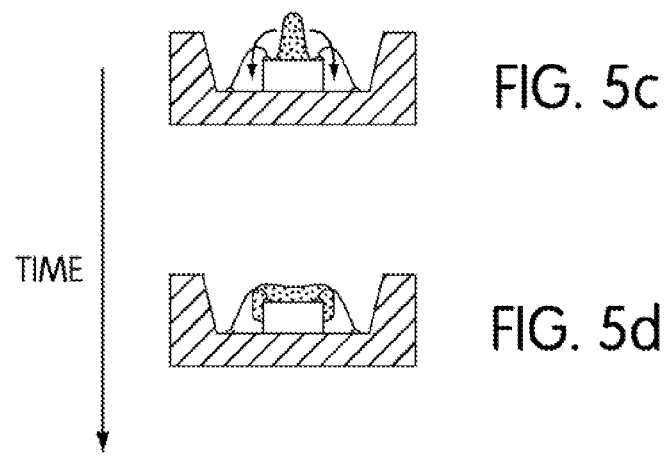
FIG. 5c
FIG. 5d
FIG. 5e
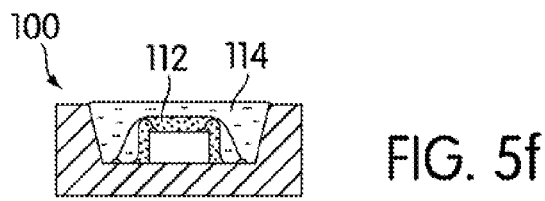
FIG. 5f

METHODS OF PRODUCING LIGHT EMITTING DEVICE WITH PHOSPHOR WAVELENGTH CONVERSION

CROSS REFERENCE TO RELATED APPLICATIONS

This Application claims the benefit of priority to U.S. Provisional Application Ser. No. 60/997,293 filed Oct. 1, 2007, entitled LIGHT EMITTING DEVICE WITH PHOSPHOR WAVELENGTH CONVERSION AND METHODS OF PRODUCING THE SAME, by Li et al., the specification and drawings of which are incorporated herein by reference.

BACKGROUND OF THE INVENTION

1. Field of the Invention

The field of the invention is directed to light emitting devices with phosphor wavelength conversion and methods of producing the same. More specifically, the invention concerns light emitting devices based on light emitting diodes (LEDs) and methods of coating one or more phosphor materials on an LED chip.

2. Description of the Related Art

White light generating LEDs ("white LEDs") are a relatively recent innovation and offer the potential for a whole new generation of energy efficient lighting systems to come into existence. It is predicted that white LEDs could replace filament (incandescent), fluorescent and compact fluorescent light sources due to their long operating lifetimes, potentially many 100,000 of hours, and their high efficiency in terms of low power consumption. It was not until LEDs emitting in the blue/ultraviolet part of the electromagnetic spectrum were developed that it became practical to develop white light sources based on LEDs. As taught, for example in U.S. Pat. No. 5,998,925, white LEDs include one or more phosphor materials, that is photo-luminescent materials, which absorb a portion of the radiation emitted by the LED and re-emit radiation of a different color (wavelength). Typically, the LED chip (die) generates blue light and the phosphor(s) absorbs a percentage of the blue light and re-emits yellow light or a combination of green and red light, green and yellow light or yellow and red light. The portion of the blue light generated by the LED that is not absorbed by the phosphor is combined with the light emitted by the phosphor to provide light which appears to the human eye as being nearly white in color.

FIG. 1 illustrates the fabrication of such a prior art white LED 10 in which the LED chip 12 is packaged in a cup-shaped package (housing) 14. The LED chip 12 is mounted to the floor of the cup (recess) and the LED chip's electrode pads are electrically connected to corresponding electrodes 16 on the floor of the package using bond wires 18. The cup (recess) is then filled with a transparent polymer material 20, often silicone, which is loaded with the powdered phosphor material(s) such that the entire surface of the LED chip is covered by the phosphor/polymer mixture. Typically the inner walls of the cup are inclined and are reflective to enhance the emission brightness of the device. Often, a lens (not shown), whose dimensions correspond to the dimensions of the cup, is then mounted on the package to focus the output light.

A problem with existing light emitting devices with phosphor wavelength conversion is that the color/correlated color temperature (CCT) of light emitted by such devices can vary across the light emitting surface of the device. The color/CCT depends on the thickness of phosphor/polymer and the distance (i.e. path length) that light travels from the LED chip through the phosphor/polymer encapsulation before being emitted from the device. As shown in FIG. 1, light 22 which is emitted substantially on axis will have traveled a shorter path length 24 within the phosphor/polymer encapsulation than light 26 emitted off axis towards the periphery of the device in which the path length 28 is correspondingly longer. As a result the light 22 emitted substantially on axis will have a higher proportion of blue light compared to yellow (phosphor generated light) and will appear to be blue-white in color. Conversely light 26 emitted off axis towards the periphery of the device will have a correspondingly higher proportion of yellow light emitted by the phosphor and will appear yellow-white in color. For general lighting applications, where for example a diffuser is used, this variation in color is not a problem as the lit object itself will also increase illumination color uniformity.

Furthermore, the inventors have appreciated that in applications in which the LED includes further optical components, in particular a lens, to focus the output light, such color/CCT variation can become a significant problem. For example for a white LED which includes a lens, the focused light spot will have a blue-white core with a pronounced yellow-white periphery. Moreover, the inventors have further appreciated that a cause of this degradation in color/CCT uniformity results from the LED's poor approximation to an ideal point source. Typically the cup, which is often circular or square in form, is a few millimeters (e.g. 3.5 mm) in dimension as compared to the light emitting surface of the chip which is relatively smaller and may be in a range of a few tens to hundreds of micrometers (50 to 500 μm) and up to one millimeter in size. Once the cup is potted with the phosphor/polymer mixture the effective light generating area of the LED becomes the size of the cup which then corresponds to the size of the lens.

In addition to the problem of non-uniformity in emitted color/CCT due to the variation in path length through the phosphor/polymer encapsulation, the inventors have discovered that the phosphor material(s) can accumulate unevenly during curing of the liquid polymer resulting in a non-uniform distribution of the phosphor material(s) over the LED chip and in particular on the edges of the LED chip, which will also emit light, where there may be little or no phosphor material(s). As illustrated in FIG. 1 the phosphor material can accumulate on the bond wires 30, on the upper surface 32 of the LED chip, on the floor 34 of the cup (recess) and on the inclined reflecting walls 36 of the package. To overcome this problem a greater quantity of phosphor material is often used though this will result in a corresponding decrease in emitted light intensity.

US 2006/0097621 teaches a method of manufacturing a white LED comprising dispensing droplets of a high viscosity liquid phosphor paste on an upper surface of the LED such that the phosphor paste is applied onto the upper surface and side surfaces of the LED and then curing the phosphor paste. The phosphor paste comprises a phosphor powder mixed with a transparent polymer resin and has a viscosity of 500~10,000 cps. The volume of the phosphor paste droplet and viscosity of the phosphor paste are selected such that the phosphor paste covers the upper surface and side surfaces of the LED and allows the phosphor paste to be uniformly applied to the side surfaces as well as the upper surface. After application of the phosphor paste the polymer resin is cured and the LED chip is connected to the package using bond wires. Finally the package is filled with a transparent polymer material to protect the bond wires. The inventors of the present invention consider that a limitation of such a method is that due to the high viscosity of the phosphor paste the manufacturing method will be too slow for viable mass production.

The present invention arose in an endeavor to reduce the physical dimensions of the light generating surface area of light emitting devices with phosphor wavelength conversion and to improve the color uniformity of the light emitted by such devices.

SUMMARY OF THE INVENTION

Embodiments of the present invention are directed to light emitting devices with phosphor wavelength conversion and in particular, although not exclusively, to a method of coating the phosphor on to an LED chip/die. In the method of the invention a mixture of a phosphor material and light transmissive material, preferably an optically clear silicone, epoxy or other polymer material, is coated on at least the light emitting surface of the chip, such that the effective size of the resulting light source corresponds to the size of the light emitting surface of the LED chip. As a result the device more closely resembles a point light source and has an improved uniformity of color light output. The effective size of the light source can range in size from a few tens of microns up to several millimeters depending on the dimensions of the LED chip.

According to the invention there is provided a method of fabricating a light emitting device comprising: mounting a light emitting diode chip in a package; heating the light emitting diode chip package assembly to a pre-selected temperature; and dispensing a pre-selected volume of a mixture of at least one phosphor and a light transmissive thermosetting material onto a surface of the chip, wherein the pre-selected volume and pre-selected temperature are selected such that the phosphor/material mixture flows over at least the light emitting surface of the chip before curing. When the LED chip comprises a surface emitting device the phosphor/material mixture is preferably dispensed on the light emitting surface and the pre-selected temperature and pre-selected volume are selected such that the phosphor/material mixture flows over substantially the entire light emitting surface to form a layer of substantially uniform thickness. When the LED chip comprises an edge emitting device the phosphor/material mixture is preferably dispensed on an upwardly facing surface and the pre-selected temperature and pre-selected volume are selected such that the mixture flows over the surface and edges of the LED chip to form a layer of substantially uniform thickness on the edges of the LED chip.

The method can further comprise selecting the pre-selected volume and pre-selected temperature such that the phosphor/material mixture flows over substantially the entire surface of the chip before curing. It is contemplated that allowing the phosphor/material mixture to additionally flow over the edges (sides) of the chip will improve the uniformity of coating thickness on the light emitting surface of a surface emitting LED chip.

In one variation of the method, the pre-selected volume and pre-selected temperature are selected such that the phosphor/material mixture forms a substantially uniform thickness layer over substantially the entire light emitting surface of the LED chip of thickness ≈100 μm to ≈300 μm.

In another variation, the pre-selected volume and pre-selected temperature are selected such that the phosphor/material mixture forms a layer on the entire light emitting surface of the LED chip that is generally a hemisphere, an oblate hemispheroid or a prolate hemispheroid in form.

The pre-selected temperature is preferably in a range 50 to 200° C., 80 to 180° C. or 120 to 160° C.

The pre-selected volume will depend on the physical dimensions of the LED chip, the thickness of the final phosphor/material layer (typically this will be ≈100 μm to ≈200 μm) and whether it is required to additionally cover edges of the LED chip. For LED chips of dimensions 50 μm to 1 mm square the pre-selected volume can be in a range ≈0.1 to ≈500 μL. Preferably the pre-selected volume is in a range ≈0.1 to ≈50 μL, ≈10 to ≈100 μL or ≈100 to ≈500 μL.

The light transmissive thermosetting material can comprise: a silicone compound such as for example GE's silicone RTV615, an epoxy material or other polymer material which is substantially transmissive to light generated by the LED chip and light generated by the at least one phosphor. The weight ratio loading of phosphor to thermosetting material is preferably in a range 5 to 50% depending on the phosphor material and desired color/correlated color temperature (CCT) of light to be generated by the device.

In one arrangement the method further comprises mounting the LED chip on a stage before mounting the chip/stage assembly in the package and selecting the pre-selected volume and pre-selected temperature such that the phosphor/material mixture flows over substantially the entire surface of the chip and stage before curing. It is contemplated that the use of a stage improves the coating uniformity on the sides of the LED chip and aids in the reliability of the coating method.

In an alternative method according to the invention a UV curable polymer material is used to apply the one or more phosphors to the LED chip. According to the invention there is provided a method of fabricating a light emitting device comprising: mounting a light emitting diode in a package; dispensing a pre-selected volume of a mixture of at least one phosphor and a light transmissive UV curable material on a surface of the chip; and after a pre-selected time irradiating the phosphor material mixture with UV radiation, wherein the pre-selected volume and pre-selected time are selected such that the phosphor/material mixture flows over at least the light emitting surface of the chip before curing. As with the method in accordance with the first aspect of the invention the phosphor/material mixture is typically dispensed onto an upwardly facing surface of the LED chip, which surface in the case of a surface emitting LED chip, comprises the light emitting surface of the chip. Additionally, a pre-selected intensity of the UV radiation can be selected such that the phosphor/material mixture flows over at least the light emitting surface of the chip before curing.

Furthermore, as in the method in accordance with the first aspect of the invention the method can further comprise selecting the pre-selected volume and pre-selected time such that the phosphor/material mixture flows over substantially the entire surface of the chip before curing. It is contemplated that allowing the phosphor/material mixture to additionally flow over the sides/edges of a surface emitting LED chip can improve the uniformity of coating thickness on the light emitting surface.

In one variation the pre-selected volume and pre-selected time are selected such that the phosphor/material mixture forms a substantially uniform thickness layer over substantially the entire light emitting surface of the LED chip of thickness ≈100 μm to ≈300 μm.

In another variation the pre-selected volume and pre-selected temperature are selected such that the phosphor/material mixture forms a layer on the entire light emitting surface of the LED chip that is generally a hemisphere, an oblate hemispheroid or a prolate hemispheroid in form.

The pre-selected time can be in a range 1 second to 10 minutes, and is preferably in a range 1 second to 1 minute, 1 second to 5 minutes or 1 second to 30 seconds. The preselected volume will depend on the size of the LED chip, the thickness of the final phosphor/material layer and whether it is required to additionally coat the edges of the LED chip. For LED chips of dimensions 50 µm to 1 mm square the pre-selected volume can be in a range ≈0.1 to ≈500 µL. Preferably, the pre-selected volume is in a range ≈0.1 to ≈50 µL, ≈10 to ≈100 µL or ≈100 to ≈500 µL.

The light transmissive UV curable material can comprise an epoxy, a silicone or UV curable polymer material. Typically the weight ratio loading of phosphor to UV curable material is in a range ≈5 to ≈50%.

In one variation the method further comprises mounting the LED chip on a stage and selecting the pre-selected volume and pre-selected time such that the phosphor/material mixture flows over substantially the entire surface of the chip and stage before curing. It is contemplated that the use of a stage improves the coating uniformity on the sides of the LED chip and aids in the reliability of the coating method.

The methods of the invention find particular application in the fabrication of white light emitting devices in which the light emitting diode chip emits blue light (400 to 480 nm) or UV (360 to 400 nm) light. With such LED chips the phosphor typically emits green or yellow light or in the case of a UV LED chip the phosphor emits a combination of blue and yellow/green light. The phosphor can comprise: a silicate; an aluminate; a nitride; a sulfate; an oxy-nitride; an oxy-sulfate or a garnet (YAG) material.

The concept of a light emitting device having a phosphor/polymer layer of a substantially uniform thickness ≈100 µm to ≈300 µm is considered to be inventive in its own right. Thus according to a further aspect of the invention there is provided a light emitting device comprising: a package, a light emitting diode chip mounted in the package and a mixture of at least one phosphor and a light transmissive polymer material provided on at least the light emitting surface of the chip, wherein the phosphor/polymer mixture is a substantially uniform thickness layer of thickness ≈100 µm to ≈300 µm.

Moreover the concept of a light emitting device in which the phosphor/polymer mixture forms a layer on the entire light emitting surface of the LED chip that is generally hemispherical in form is considered inventive in its own right. According to a yet further aspect of the invention there is provided a light emitting device comprising: a package, a light emitting diode chip mounted in the package and a mixture of at least one phosphor and a light transmissive polymer material provided on at least the light emitting surface of the chip, wherein the phosphor/polymer mixture is generally a hemisphere, an oblate hemispheroid or a prolate hemispheroid in form.

BRIEF DESCRIPTION OF THE DRAWINGS

In order that the present invention is better understood embodiments of the invention will now be described, by way of example only, with reference to the accompanying drawings in which:

FIGS. 5(a) to 5(f) are schematic representations of method steps in accordance with the invention for coating a phosphor on an LED chip.

DETAILED DESCRIPTION OF THE INVENTION

1. Description of Preferred Embodiments

Figure 1:
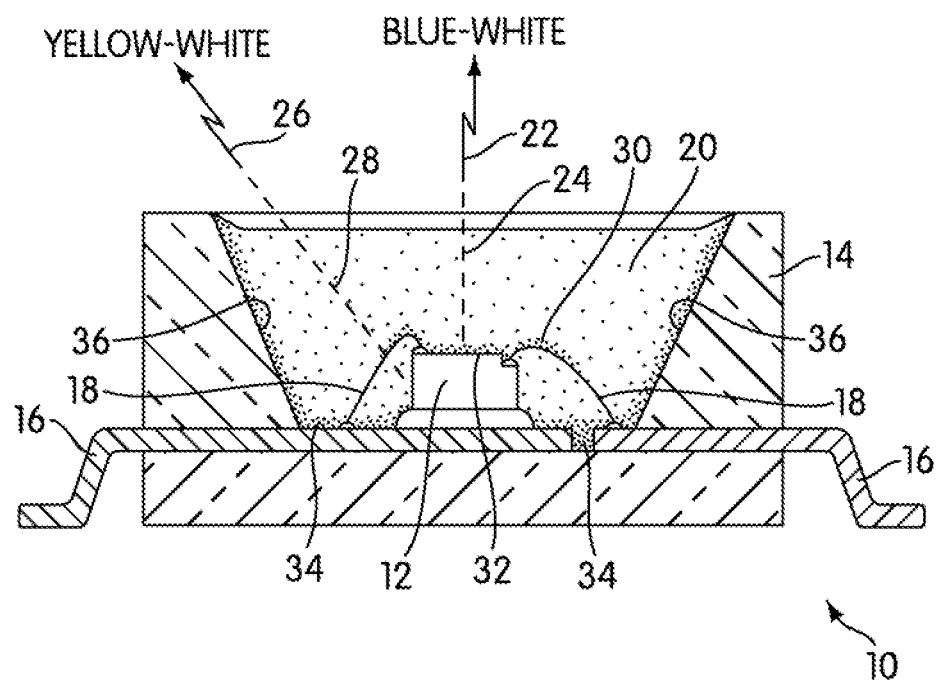
FIG. 1 is a schematic sectional representation of a prior art white LED as previously described.

Throughout this specification the same reference numerals are used to denote like parts.

Figure 2:
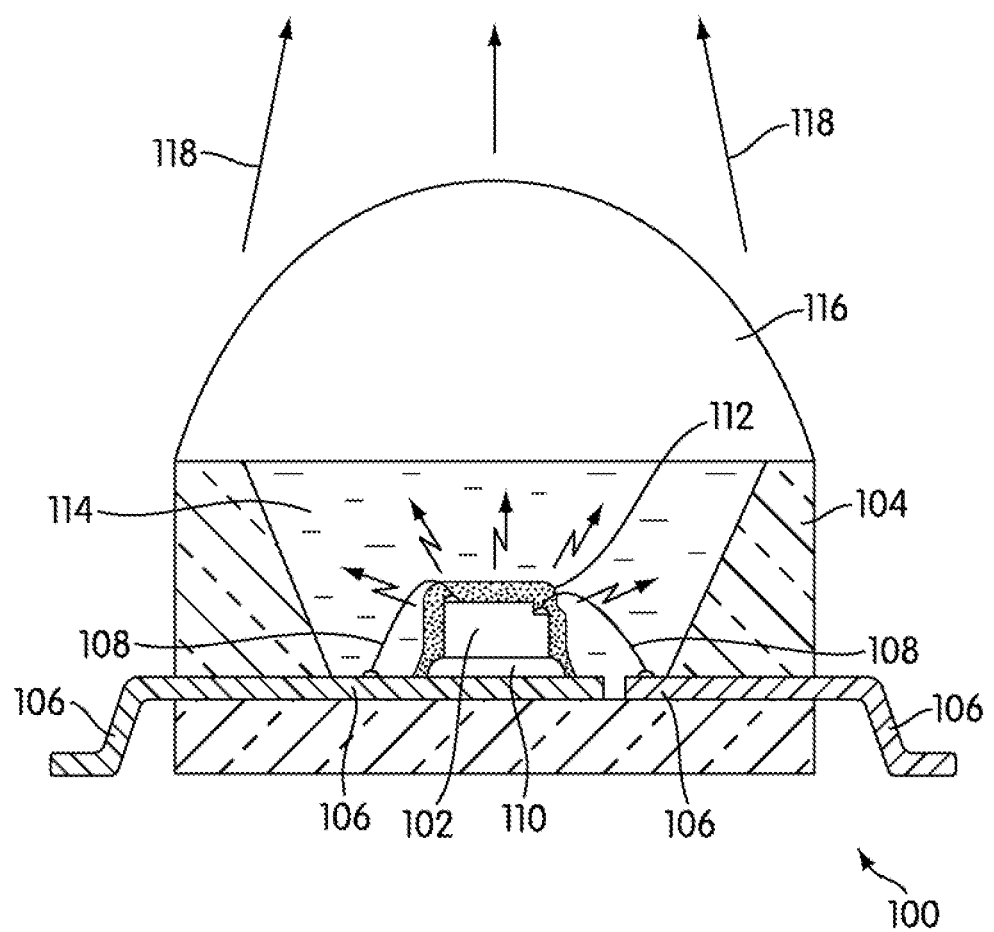
FIG. 2 is a schematic sectional representation of a light emitting device with phosphor wavelength conversion in accordance with an embodiment of the invention.

FIG. 2 is a schematic representation of a light emitting device 100 with phosphor wavelength conversion in accordance with an embodiment of the invention. The device 100 is intended to generate white light and comprises an LED chip 102 which is mounted within a package (housing) 104. As illustrated the package can comprise a low temperature co-fired ceramic (LTCC) package which has a recess for receiving one or more LED chips 102. The walls of the recess are inclined to reflect light in a direction out of the recess. In other arrangements the package 104 can comprise an array of recesses each of which is configured to receive one or more LED chips. Alternatively, the package can comprise a metallic cup, a high temperature polymer package or other package as known in the art. A metallic cup can aid in thermal management of the chip 102.

The LED chip 102 which can comprise a surface emitting ZnSe (zinc selenide) or InGaN (indium gallium nitride) blue light (≈400 to ≈480 nm) emitting LED chip is mounted to the floor of the recess and the chip's 102 electrode pads are electrically connected to corresponding electrodes 106 on the floor of the recess by bond wires 108. In general the LED chip 102 is square or rectangular in form and is of dimensions 50 µm to 500 µm, typically 300 µm square with a thickness of 100 µm to 200 µm. The LED chip 102 can be mounted 110 to the floor of the recess using an adhesive, soldering, flip chip bonding or other techniques that will be apparent to those skilled in the art. A phosphor, photo-luminescent, material/polymer mixture 110 is provided as a substantially uniform thickness layer over the entire light emitting surface of the chip (i.e. the upper surface as shown in FIG. 2) and edges (sides) of the LED chip which will also emit light to a lesser extent. As will be apparent from FIG. 2 the phosphor material is only coated on the light emitting surface and edges of the LED chip 102. The phosphor layer is typically of thickness in a range 100 µm to 300 µm, preferably approximately 200 µm, with the exact thickness depending on the type of phosphor material, the weight loading of phosphor material to light transmissive polymer material and the required color temperature of white light generated by the device.

To enhance light emission from the LED chip the volume of the recess can be filled with a transparent polymer material 114 to provide refractive index matching between the phosphor/polymer layer and transparent polymer. The transparent polymer material can comprise any material which is substantially transparent (transmissive) to light generated by the LED chip 102 and phosphor material 112 and will typically comprise a silicone or epoxy material. Optionally, a lens 116 can be provided over the recess opening to focus or otherwise direct light 118 emitted by the device 100. The emission product 118 of the device will typically be white light and comprises the combination of light generated by the LED chip and light generated by photoluminescence of the phosphor material 112.

The phosphor material which is in preferably in a powder form can comprise an inorganic or organic phosphor such as for example silicate-based phosphor of a general composition $A_3Si(O,D)_5$ or $A_2Si(O,D)_4$ in which Si is silicon, O is oxygen, A comprises strontium (Sr), barium (Ba), magnesium (Mg) or calcium (Ca) and D comprises chlorine (Cl), fluorine (F), nitrogen (N) or sulfur (S). Examples of silicate-based phosphors are disclosed in our co-pending patent applications US2006/0145123, US2006/0261309, US2007/0029526 and patent U.S. Pat. No. 7,311,858 (also assigned to Internatix Corporation) the content of each of which is hereby incorporated by way of reference thereto.

As taught in US2006/0145123, a europium ($Eu^{2+}$) activated silicate-based green phosphor has the general formula $(Sr,A_1)_x(Si,A_2)(O,A_3)_{2+x}:Eu^{2+}$ in which: $A_1$ is at least one of a $2^+$ cation, a combination of $1^+$ and $3^+$ cations such as for example Mg, Ca, Ba, zinc (Zn), sodium (Na), lithium (Li), bismuth (Bi), yttrium (Y) or cerium (Ce); $A_2$ is a $3^+$, $4^+$ or $5^+$ cation such as for example boron (B), aluminum (Al), gallium (Ga), carbon (C), germanium (Ge), N or phosphorus (P); and $A_3$ is a $1^-$, $2^-$ or $3^-$ anion such as for example F, Cl, bromine (Br), N or S. The formula is written to indicate that the $A_1$ cation replaces Sr; the $A_2$ cation replaces Si and the $A_3$ anion replaces oxygen. The value of x is an integer or non-integer between 1.5 and 2.5.

U.S. Pat. No. 7,311,858 discloses a silicate-based yellow-green phosphor having a formula $A_2SiO_4:Eu^{2+}$ D, where A is at least one of a divalent metal comprising Sr, Ca, Ba, Mg, Zn or cadmium (Cd); and D is a dopant comprising F, Cl, Br, iodine (I), P, S and N. The dopant D can be present in the phosphor in an amount ranging from about 0.01 to 20 mole percent and at least some of the dopant substitutes for oxygen anions to become incorporated into the crystal lattice of the phosphor. The phosphor can comprise $(Sr_{1-x-y}Ba_xM_y)SiO_4:EU^{2+}D$ in which M comprises Ca, Mg, Zn or Cd and where $0 \le x \le 1$ and $0 \le y \le 1$.

US2006/0261309 teaches a two phase silicate-based phosphor having a first phase with a crystal structure substantially the same as that of $(M1)_2SiO_4$; and a second phase with a crystal structure substantially the same as that of $(M2)_3SiO_5$ in which M1 and M2 each comprise Sr, Ba, Mg, Ca or Zn. At least one phase is activated with divalent europium ($Eu^{2+}$) and at least one of the phases contains a dopant D comprising F, Cl, Br, S or N. It is believed that at least some of the dopant atoms are located on oxygen atom lattice sites of the host silicate crystal.

US2007/0029526 discloses a silicate-based orange phosphor having the formula $(Sr_{1-x}M_x)_yEu_zSiO_5$ in which M is at least one of a divalent metal comprising Ba, Mg, Ca or Zn; $0<x<0.5$; $2.6<y<3.3$; and $0.001<z<0.5$. The phosphor is configured to emit visible light having a peak emission wavelength greater than about 565 nm.

The phosphor can also comprise an aluminate-based material such as is taught in our co-pending patent application US2006/0158090 and U.S. Pat. No. 7,390,437 (also assigned to Internatix Corporation) or an aluminum-silicate phosphor as taught in co-pending application US2008/0111472 the content of each of which is hereby incorporated by way of reference thereto.

US2006/0158090 teaches an aluminate-based green phosphor of formula $M_{1-x}Eu_xAl_yO_{[1+3y/2]}$ in which M is at least one of a divalent metal comprising Ba, Sr, Ca, Mg, Mn, Zn, Cu, Cd, Sm or thulium (Tm) and in which $0.1<x<0.9$ and $0.5 \le y \le 12$.

U.S. Pat. No. 7,390,437 discloses an aluminate-based blue phosphor having the formula $(M_{1-x}Eu_x)_{2-z}Mg_zAl_yO_{[2+3y/2]}$ in which M is at least one of a divalent metal of Ba or Sr. In one composition the phosphor is configured to absorb radiation in a wavelength ranging from about 280 nm to 420 nm, and to emit visible light having a wavelength ranging from about 420 nm to 560 nm and $0.05<x<0.5$ or $0.2<x<0.5$; $3 \le y \le 12$ and $0.8 \le z \le 1.2$. The phosphor can be further doped with a halogen dopant H such as Cl, Br or I and be of general composition $(M_{1-x}Eu_x)_{2-z}Mg_zAl_yO_{[2+3y/2]}:H$.

US2008/0111472 teaches an aluminum-silicate orange-red phosphor with mixed divalent and trivalent cations of general formula $(Sr_{1-x-y}M_xT_y)_{3-m}Eu_m(Si_{1-z}Al_z)O_5$ in which M is at least one divalent metal selected from Ba, Mg or Ca in an amount ranging from $0 \le x \le 0.4$; T is a trivalent metal selected from Y, lanthanum (La), Ce, praseodymium (Pr), neodymium (Nd), promethium (Pm), samarium (Sm), gadolinium (Gd), terbium (Tb), dysprosium (Dy), holmium (Ho), Erbium (Er), Tm, ytterbium (Yt), lutetium (Lu), thorium (Th), protactinium (Pa) or uranium (U) in an amount ranging from $0 \le y \le 0.4$ and z and m are in a range $0 \le z \le 0.2$ and $0.001 \le m \le 0.5$. The phosphor is configured such that the halogen resides on oxygen lattice sites within the silicate crystal.

The phosphor can also comprise a nitride-based red phosphor material such as is taught in our co-pending provisional patent application 61/054,399 the content of which is hereby incorporated by way of reference thereto. 61/054,399 teaches a nitride-based red phosphor having the formula $M_mM_aM_bD_{3w}N_{[(2/3)m+z+a+(4/3)b-w]}Z_x$ where $M_m$ is a divalent element selected from beryllium (Be), Mg, Ca, Sr, Ba, Zn, Cd or mercury (Hg); $M_a$ is a trivalent element selected from B, Al, Ga, In, Y, Se, P, As, La, Sm, antimony (Sb) or Bi; $M_b$ is a tetravalent element selected from C, Si, Ge, tin (Sn), Ni, hafnium (Hf), molybdenum (Mo), tungsten (W), Cr, Pb, Ti or zirconium (Zr); D is a halogen selected from F, Cl, Br or I; Z is an activator selected from Eu, Ce, Mn, Tb or Sm, and N is nitrogen in amounts $0.01 \le m \le 1.5$, $0.01 \le a \le 1.5$, $0.01 \le b \le 1.5$, $0.0001 \le w \le 0.6$ and $0.0001 \le z \le 0.5$. The phosphor is configured to emit visible light with an emission peak wavelength greater than 640 nm.

It will be appreciated that the phosphor material is not limited to the examples described herein and can comprise any phosphor material including both organic or inorganic phosphor materials such as for example nitride and/or sulfate phosphor materials, oxy-nitrides and oxy-sulfate phosphors or garnet materials (YAG).

The method of applying the phosphor to the LED chip is described later.

Figure 3:
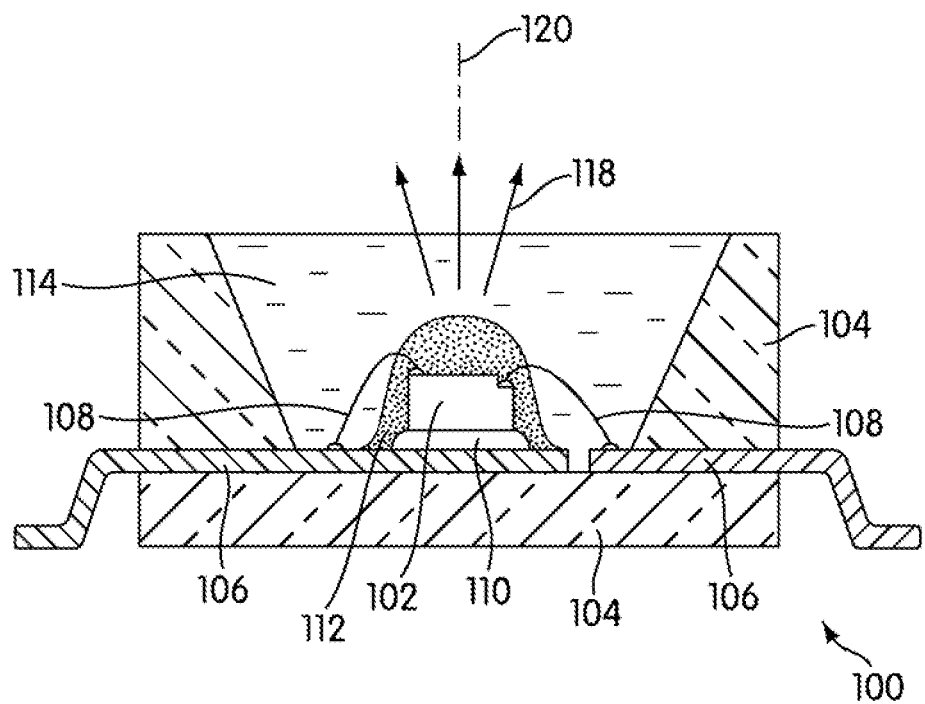
FIG. 3 is a schematic sectional representation of a light emitting device with phosphor wavelength conversion in accordance with a further embodiment of the invention.

FIG. 3 is a schematic representation of a light emitting device 100 with phosphor wavelength conversion in accordance with a further embodiment of the invention. As with the embodiment of FIG. 2 the device 100 comprises an LED chip 102 which is mounted within an LTCC package 104. In this embodiment the phosphor/polymer material 110 is provided over the entire light emitting surface of the chip, that is the upper face as illustrated and edges of the chip. Unlike the embodiment shown in FIG. 2, the phosphor is not a uniform thickness layer over the light emitting surface and is thicker along the principal light emitting axis 120 of the chip 102 such that the resultant phosphor/polymer layer 112 has an external surface that is generally hemispherical, oblate hemispheroid, prolate hemispheroid or dome-shaped in form. It is to be noted that as with the embodiment in FIG. 2 little or no phosphor material is provided on the floor of the recess. Although not illustrated it will be appreciated that the device 100 can additionally include a lens or other optical component over the front opening of the recess for focusing and/or directing light emitted by the device. In other arrangements it is contemplated that the phosphor/polymer be provided on the light emitting surface only and be generally a hemisphere, an oblate hemispheroid or a prolate hemispheroid in form.

Figure 4:
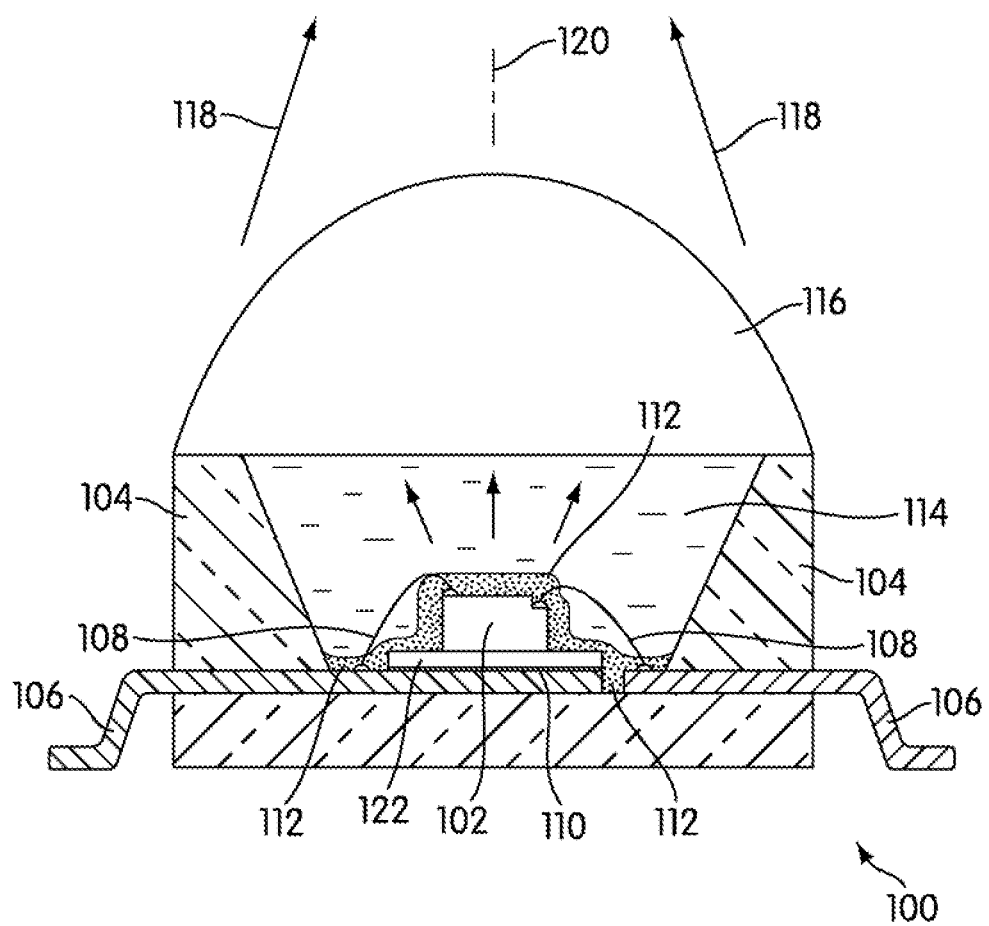
FIG. 4 is a schematic sectional representation of a light emitting device with phosphor wavelength conversion in accordance with a yet further embodiment of the invention.

FIG. 4 is a schematic representation of a light emitting device 100 with phosphor wavelength conversion in accordance with a yet further embodiment of the invention. In this embodiment the device 100 comprises an LED chip 102 which is mounted on a stage 122 and the chip/stage assembly 102/122 is then mounted within the recess of the package 104. The phosphor 112 is provided as a substantially uniform thickness layer over the light emitting surface of the LED chip, sides of the LED chip and also the surface of the stage. As shown the phosphor layer can further extend over the floor of the recess without degrading the color/CCT uniformity of light generated by the device.

2. Methods of Applying the Phosphor Material 2.1 Thermosetting Polymer Material

In a first method of the invention a light transmissive (transparent) thermosetting polymer material is used to apply the phosphor to the LED chip 102. In the context of this patent application "transparent" and "light transmissive" mean substantially transmissive to both the excitation radiation emitted by the LED chip and light generated by the phosphor. The method is illustrated in FIGS. 5(a) to 5(f).

The phosphor material, which is in powder form, is thoroughly mixed with the clear thermosetting polymer material such as for example a fast-drying silicone. An example of a suitable silicone material is GE's silicone RTV615 which has a curing temperature of approximately 150° C. It will be appreciated that other transparent polymer materials can be used such as epoxy. The weight ratio loading of phosphor to silicone is in a range 5 to 50% depending on the required color/CCT of illumination product 118 of the device. Firstly, the packaged LED chip is heated in a temperature controlled environment, such as for example on a hot plate, to a pre-selected temperature $T_p$ which depends on the transparent polymer material and the time for which the phosphor/polymer mixture is allowed to flow (FIG. 5(a)). Typically, the pre-selected temperature is in a range 50 to 200° C. to minimize the risk of damage to the LED chip. More typically the pre-selected temperature is in a range 80 to 180° C. or 120 to 160° C. A pre-selected volume $V_p$ of phosphor/polymer mixture 124 is then dispensed onto the light emitting surface of the LED chip 102, by for example dropping a measured quantity from an automatic dispenser such as a nano-liter size plunger type dispenser head made by Asymtek, a syringe or alike (FIG. 5(b)). Under the influence of gravity the phosphor/polymer mixture flows over the entire light emitting surface of the LED chip and down the sides of the chip (FIGS. 5b to 5e). The pre-selected volume $V_p$ and temperature $T_p$ are selected such that the polymer cures once the mixture just covers at least the light emitting surface and edges of the LED chip 102. In the context of this application "cures" means that the polymer has cured to a point at which its viscosity is sufficiently high enough that the polymer no longer continues to flow. It does not imply that the polymer material is fully cured which will often take considerably longer. To improve coating uniformity the pre-selected volume $V_p$ and temperature $T_p$ can be selected such that the silicone cures once the mixture covers the edges of the chip. Optionally, and as shown in FIG. 5(f) the recess of the package can be filled with a light transmissive polymer 114 to protect the bond wires 108 and to provide environmental protection of the phosphor/polymer layer 112.

The method described results in the light emitting device 100 of FIG. 2. For a device using a surface emitting LED chip 102 which is 300 μm square and 200 μm thick it is contemplated that the pre-selected volume $V_p$ of phosphor/polymer mixture is of the order of ≈10 to ≈20 μL (micro-liters) where it is required to coat the light emitting surface of the LED chip only and ≈50 to ≈100 μL where it is additionally required to coat the edges of the chip. For a 1 mm square LED chip it is contemplated that the pre-selected volume $V_p$ is of order ≈100 to ≈200 μL when it is required to coat the light emitting surface of the LED chip only and ≈200 to ≈500 μL where it is additionally required to coat the edges of the chip. For a 50 μm square LED chip it is contemplated that the pre-selected volume $V_p$ is of order ≈0.1 to ≈0.5 μL (i.e. 100 to 500 nL nano-liters) where it is required to coat the light emitting surface of the LED chip only and ≈20 to ≈50 μL where it is additionally required to coat the edges of the chip. The pre-selected temperature $T_p$ is typically within a range ≈80 to ≈180° C. and more especially within a range ≈120 to ≈160° C.

The light emitting device 100 of FIG. 3 can also be fabricated using the same method by appropriate selection of the pre-selected temperature $T_p$, pre-selected volume $V_p$ and by selecting a light transmissive material with an appropriate stickiness/tackiness.

In the light emitting device 100 of FIG. 4 the LED chip 102 is mounted on a stage 122 to assist in the coating uniformity of the edges of the chip. It is contemplated that the use of a stage 122 simplifies the coating process and improves reliability. As described a pre-selected measured quantity $V_p$ of phosphor/polymer mixture is dispensed onto the LED chip surface and the mixture will then flow across the surface and down the sides of the chip, over the stage and onto the floor of the recess surrounding the stage. During curing, the LED chip assembly is maintained at a lower pre-selected temperature to permit the phosphor/polymer mixture to flow for a longer period of time and the temperature selected such that the polymer is cured at a time when flow of the mixture is complete. The stage 122 ensures that phosphor/polymer mixture on the floor of the recess surrounding the LED chip makes virtually no contribution to the light 118 generated since the phosphor material in this region cannot be excited directly by light emitted from the LED chip. In other variations the phosphor/polymer can be applied to the chip/stage assembly before mounting the chip/stage assembly in the package.

The color/CCT of light generated by the device can be controlled by:

The concentration (weight ratio loading) of phosphor in the phosphor/thermosetting material mixture.

The pre-selected volume $V_p$ of phosphor/thermosetting material mixture dispensed.

The pre-selected temperature $T_p$ used to cure the thermosetting material. A higher pre-selected temperature compared with the curing temperature will reduce flow of the phosphor/thermosetting material mixture and result in a relatively thicker phosphor layer.

The viscosity of the thermosetting material.

The stickiness/tackiness of the thermosetting material.

2.2 UV Curable Polymer Material

In an alternative method of the invention a light transmissive (transparent) UV (ultra violet) curable polymer material is used to apply the phosphor material to the LED chip. The method is illustrated in FIGS. 6(a) to 6(e).

Figure 6A:
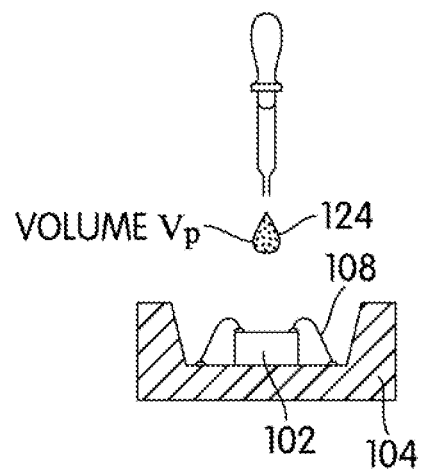
FIGS. 6(a) to 6(e) are schematic representations of method steps in accordance with a further embodiment of the invention for coating a phosphor on an LED chip.
Figure 6B:
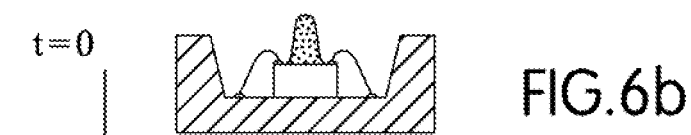
Figure 6C:
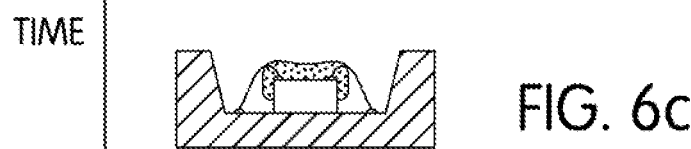
Figure 6D:
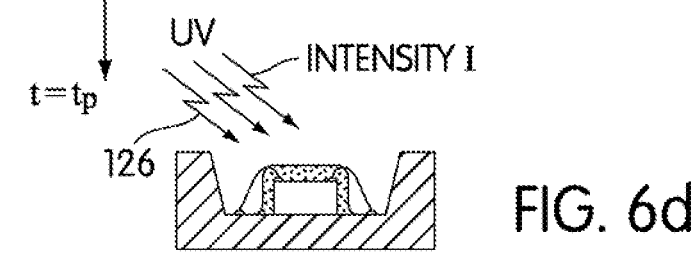
Figure 6E:
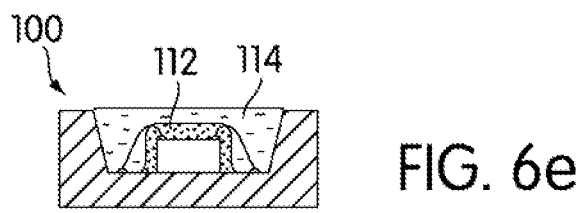

The powdered phosphor material is thoroughly mixed with the transparent UV curable polymer material such as a transparent UV curable epoxy or silicone. The weight ratio loading of phosphor to polymer is in a range 5 to 50% depending on the required color/CCT illumination product of the device. A pre-measured volume $V_p$ of phosphor/polymer mixture 124 is dispensed onto the light surface of the chip, by for example dropping a measured quantity from an automatic dispenser, syringe or alike (FIG. 6(a)). Under the influence of gravity the phosphor/polymer mixture flows over the entire light emitting surface of the LED chip 102 and down the sides of the chip (FIGS. 6(b) to 6(c)). After a pre-selected time $t_p$, corresponding to when the phosphor/epoxy mixture has just flowed over the sides of the chip, the phosphor/epoxy mixture is then irradiated with UV radiation 126 of a pre-selected intensity I (FIG. 6(d)) to cure the epoxy. Curing of the epoxy can take a few milliseconds to seconds depending on the intensity and wavelength of the UV radiation. The pre-selected time $t_p$, volume $V_p$ and intensity I are selected such that the epoxy cures once the mixture just covers at least the light emitting surface of the chip. To improve coating uniformity the pre-selected time $t_p$, volume $V_p$ and intensity I can be selected such that the epoxy cures once the phosphor mixture additionally covers the edges of the chip. Optionally, and as shown in FIG. 6(e) the recess of the package can be filled with a light transmissive polymer 114 to protect the bond wires 108 and to provide environmental protection of the phosphor/polymer layer 112.

As with the method using a thermosetting polymer material the pre-selected volume $V_p$ of phosphor/polymer mixture will depend on the LED chip size, the required thickness of the final phosphor/polymer layer and whether it is required to additionally coat the edges of the LED chip. Accordingly, it is contemplated that the pre-selected volume $V_p$ will typically be in a range ≈0.1 to ≈500 μL, ≈0.1 to ≈50 μL, ≈10 to ≈100 μL or ≈100 to ≈500 μL. Typically, the pre-selected time can be of the order of 1 second to 10 minutes and is preferably in a range 1 second to 5 minute, 1 second to 1 minute or 1 second to 30 seconds to enable rapid fabrication.

In one arrangement, which utilizes an automatic phosphor/polymer mixture dispenser, the dispenser head incorporates a UV irradiation source such that dispensing and curing of the phosphor mixture can be performed in a single automated operation. In one such dispenser the UV radiation source can be located remote to a dispensing nozzle of the dispensing head and an optical fiber used to guide the UV light to the vicinity of the dispensing head. As is known, LEDs are often fabricated in large numbers in the form of an array on a lead frame. The UV cured method of the invention finds particular application to fabrication on a lead frame when an automatic translation stage is used to accurately position the LED chip for phosphor/polymer dispensing. In other arrangements where the LED chip emits UV light, such as an AlGaN (aluminum gallium nitride) or AlN (aluminum nitride) based LED chips, the LED chip can be used to cure the phosphor/polymer mixture by connecting the chip to a suitable power supply.

The method described can be used to fabricate the light emitting device 100 shown in FIG. 2. Moreover, the light emitting device 100 of FIG. 3 can also be fabricated using the UV curable polymer method by selecting an UV curable polymer with an appropriate stickiness/tackiness to limit the flow and change the shape/form of the final coating. The light emitting device arrangement of FIG. 3 can also be fabricated by appropriate selection of the pre-selected time $t_p$, volume $V_p$ and intensity I of the UV irradiation.

In the light emitting device 100 of FIG. 4 the LED chip 102 is mounted on a stage 122 to assist in the coating uniformity of the sides of the chip 102. It is contemplated that the use of a stage simplifies the coating process and improve reliability. As described a pre-selected measured quantity $V_p$ of phosphor/polymer mixture is dispensed onto the chip surface and the mixture is then allowed to flow across the surface and down the edges of the chip, over the stage and onto the floor of the cup 404 surrounding the stage. The stage 410 ensures that phosphor material on the floor of the recess surrounding the LED chip makes virtually no contribution to the light generated by the device since the phosphor material in this region cannot be excited directly by light from the LED chip.

The color/CCT of the light 118 generated by the device can be controlled by:

The concentration of phosphor in the phosphor/UV curable polymer material mixture.

The pre-selected volume $V_p$ of phosphor/UV curable polymer material mixture dispensed.

The pre-selected time $t_p$ between dispensing the phosphor/polymer mixture and irradiating the phosphor/polymer mixture with UV light. The time $t_p$ at which the material is irradiated will affect the thickness of the phosphor layer.

The pre-selected intensity I of UV radiation used to cure the UV curable material. A higher pre-selected intensity will reduce flow of the phosphor/UV cured material during curing and will result in a relatively thicker phosphor layer. To a lesser extent the wavelength of the UV radiation used to cure the UV cured material will affect the curing time.

The viscosity of the UV cured material.

The tackiness of the UV cured material.

It will be appreciated that the present invention is not restricted to the specific embodiments described and that variations can be made that are within the scope of the invention. For example other light transmissive (transparent) thermosetting or UV curable materials can be used to bond the phosphor to the LED chip.

Moreover, whilst the present invention finds particular application in the fabrication of white light emitting devices it will be appreciated that the methods of the invention apply equally to light emitting devices with phosphor wavelength conversion that generate other color illumination products.

The present invention is also suitable for applying one or more phosphor materials to edge emitting LED chips. For such LED chips the phosphor/polymer mixture is dispensed onto an upper surface (non-light emitting surface) and allowed to flow over the light emitting edges of the LED chip.

What is claimed is:

1. A method of fabricating a light emitting device comprising:
    selecting a desired color for the light emitting device to emit when operated;
    mounting a light emitting diode chip in a package, the light emitting diode chip comprising a light emitting surface;
    determining together for a particular mixture of at least one phosphor and a light transmissive thermosetting material both a dispensing volume of said particular mixture and a temperature for said package that will cause dispersion and curing of said particular mixture on said mounted package that will cause the light emitting device when operated to emit the desired color;
    heating the package to the determined temperature;
    dispensing the determined volume onto the light emitting surface of the chip; and
    the heating temperature and dispensed volume together causing the mixture of the at least one phosphor and the light transmissive thermosetting material to flow over and cover at least the light emitting surface of the chip; and
    the heating temperature and selected volume together causing the mixture of the at least one phosphor and the light transmissive thermosetting material to cure at a thickness that causes the light emitting device when operated to emit the desired color.

2. The method of claim 1, and comprising selecting the volume and temperature such that the mixture of the at least one phosphor and the light transmissive thermosetting material flows over substantially the entire surface of the chip before curing.

3. The method of claim 1, wherein the volume and temperature are selected such that the mixture of the at least one phosphor and the light transmissive thermosetting material forms a substantially uniform thickness layer over substantially the entire light emitting surface of the LED chip of thickness ≈100 μm to ≈300 μm.

4. The method of claim 1, wherein the volume and temperature are selected such that the mixture of the at least one phosphor and the light transmissive thermosetting material forms a layer on the entire light emitting surface of the LED chip that is generally a hemisphere, an oblate hemispheroid or a prolate hemispheroid in form.

5. The method of claim 1, wherein the temperature is selected from the group consisting of: 50 to 200° C., 80 to 180° C. and 120 to 160° C.

6. The method of claim 1, wherein the volume is selected from the group consisting of: ≈0.1 to ≈500 μL, ≈0.1 to ≈50 μL, ≈10 to ≈100 μL and ≈100 to ≈500 μL.

7. The method of claim 1, wherein the light transmissive thermosetting material is selected from the group consisting of: a silicone, an epoxy and a polymer material.

8. The method of claim 1, wherein the weight ratio loading of phosphor to thermosetting material is in a range 5 to 50%.

9. The method of claim 1, and further comprising mounting the light emitting diode chip on a stage before mounting the chip/stage in the package and selecting the volume and temperature such that the mixture of the at least one phosphor and the light transmissive thermosetting material flows over substantially the entire surface of the chip and stage before curing.

10. A method of fabricating a light emitting device comprising:
selecting a desired color for the light emitting device to emit when operated;
mounting a light emitting diode chip in a package, the light emitting diode chip comprising a light emitting surface;
determining together for a particular mixture of at least one phosphor and a light transmissive UV curable material both a dispensing volume and a setting time that will cause the light emitting device when operated to emit the desired color;
dispensing the determined volume onto the light emitting surface of the chip; and
the dispensed volume and the waiting together causing the mixture of the at least one phosphor and the light transmissive UV curable material to flow over and cover at least the light emitting surface of the chip and to cure at a thickness that causes the light emitting device when operated to emit the desired color.

11. The method of claim 10, and further comprising selecting an intensity of the UV radiation such that the mixture of the at least one phosphor and the light transmissive thermosetting material flows over and covers at least the light emitting surface of the chip before curing.

12. The method of claim 10, and further comprising selecting the volume and time such that the mixture of the at least one phosphor and the light transmissive thermosetting material flows over and covers substantially the entire surface of the chip before curing.

13. The method of claim 10, and further comprising selecting the volume and the time such that the mixture of the at least one phosphor and the light transmissive thermosetting material forms a substantially uniform thickness layer over substantially the entire light emitting surface of the LED chip of thickness ≈100 μm to ≈300 μm.

14. The method of claim 10, and further comprising selecting the volume and the time such that the mixture of the at least one phosphor and the light transmissive thermosetting material forms a layer on the entire light emitting surface of the LED chip that is generally a hemisphere, an oblate hemispheroid or a prolate hemispheroid in form.

15. The method of claim 10, and further comprising selecting the time from the group consisting of: 1 second to 10 minutes, 1 second to 1 minute, 1 second to 5 minutes, and 1 second to 30 seconds.

16. The method of claim 10, and further comprising selecting the volume from the group consisting of: ≈0.1 to ≈500 μL, ≈0.1 to ≈50 μL, ≈10 to ≈100 μL and ≈100 to ≈500 μL.

17. The method of claim 10, wherein the light transmissive UV curable material is selected from the light consisting of: an epoxy, a silicone and a polymer material.

18. The method of claim 10, wherein the weight ratio loading of phosphor to UV cured material is in a range ≈5 to ≈50%.

19. The method of claim 10, and further comprising mounting the light emitting diode chip on a stage before mounting the chip on the stage in the package and selecting the volume and time such that the mixture of the at least one phosphor and the light transmissive thermosetting material flows over and covers substantially the entire surface of the chip and stage before curing.

* * * * *